United States Patent
Chen et al.

(10) Patent No.: US 12,520,624 B2
(45) Date of Patent: Jan. 6, 2026

(54) LIGHT-EMITTING DEVICE

(71) Applicant: TIANJIN SANAN OPTOELECTRONICS CO., LTD., Tianjin (CN)

(72) Inventors: Jinghua Chen, Xiamen (CN); Yenchin Wang, Xiamen (CN); Chong Xu, Xiamen (CN); Shasha Chen, Tianjin (CN); Kunte Lin, Tianjin (CN); Kaiqing Xu, Fujian (CN); Shihchieh Hou, Tianjin (CN); Shao-Hua Huang, Fujian (CN); Huanshao Kuo, Fujian (CN); Yu-Ren Peng, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 371 days.

(21) Appl. No.: 18/347,984

(22) Filed: Jul. 6, 2023

(65) Prior Publication Data
US 2024/0030376 A1  Jan. 25, 2024
US 2024/0266463 A2  Aug. 8, 2024

(30) Foreign Application Priority Data
Jul. 20, 2022 (CN) .......................... 202210852154.8

(51) Int. Cl.
*H10H 20/812* (2025.01)
*H10H 20/821* (2025.01)
*H10H 20/824* (2025.01)

(52) U.S. Cl.
CPC ........ *H10H 20/812* (2025.01); *H10H 20/821* (2025.01); *H10H 20/8242* (2025.01)

(58) Field of Classification Search
CPC . H10H 20/812; H10H 20/821; H10H 20/8242
See application file for complete search history.

(56) References Cited

U.S. PATENT DOCUMENTS

| | | | | |
|---|---|---|---|---|
| 7,851,813 B2* | 12/2010 | Kim | ..................... | H10H 20/812 |
| | | | | 257/89 |
| 8,624,221 B2* | 1/2014 | Won | ..................... | H10H 20/812 |
| | | | | 438/20 |
| 2012/0145993 A1* | 6/2012 | Na | ....................... | H10H 20/812 |
| | | | | 257/E33.012 |

(Continued)

*Primary Examiner* — Mark W Tornow
(74) *Attorney, Agent, or Firm* — Muncy, Geissler, Olds & Lowe, P.C.

(57) ABSTRACT

A light-emitting device includes a semiconductor epitaxial structure that has a first surface and a second surface, and that includes a first semiconductor layer, an active layer, and a second semiconductor layer. The active layer includes a quantum well structure having multiple periodic units, each including a well layer and a barrier layer greater in bandgap than the well layer. The bandgap of the barrier layer of at least one of the periodic units proximate to the first surface is smaller than that proximate to the second surface, and a thickness of the well layer of at least one of the periodic units proximate to the first surface is greater than that proximate to the second surface. In some embodiments, a bandgap of a second spacing layer disposed between the active and second semiconductor layers increases in a direction from the first surface to the second surface.

20 Claims, 10 Drawing Sheets

(56) References Cited

U.S. PATENT DOCUMENTS

2016/0111594 A1* 4/2016 Nagel ................ H10H 20/812
  257/13
2021/0066542 A1* 3/2021 Lin .................... H10H 20/825
2023/0402566 A1* 12/2023 Yoo ................... H10H 20/812

* cited by examiner

| Samples | @0hr | @0.1hr | @1hr | @4hr |
|---|---|---|---|---|
| Conventional light-emitting device | 0.0% | -1.7% | -13.6% | -17.5% |
| First embodiment | 0.0% | 1.3% | -6.2% | -7.9% |
| Second embodiment | 0.0% | 1.8% | -0.5% | -1.5% |

FIG.16

LIGHT-EMITTING DEVICE

CROSS-REFERENCE TO RELATED APPLICATION

This application claims priority to Chinese Invention Patent Application No. 202210852154.8, filed on Jul. 20, 2022.

FIELD

The disclosure relates to a semiconductor device, and more particularly to a light-emitting device.

BACKGROUND

Light-emitting diodes (LEDs) are considered to be one of the light sources having the most potential as they offer advantages including high luminous intensity, high efficiency, small size, and long lifespan. In recent years, LEDs have been widely applied in various fields, such as lighting, signal display, backlight, automotive light, big screen display, etc., all of which ask for a higher level of luminous intensity, luminous efficiency, and anti-aging performance of the LEDs.

SUMMARY

Therefore, an object of the disclosure is to provide a light-emitting device that can alleviate at least one of the drawbacks of the prior art.

According to one aspect of the disclosure, the light-emitting device includes a semiconductor epitaxial structure that has a first surface and a second surface opposite to the first surface, and that includes a first semiconductor layer, an active layer, and a second semiconductor layer sequentially stacked on one another in such order from the first surface to the second surface. The active layer includes a quantum well structure having multiple periodic units, each of which includes a well layer and a barrier layer disposed sequentially in such order, and a bandgap of the barrier layer is greater than that of the well layer. The bandgap of the barrier layer of at least one of the periodic units proximate to the first surface of the semiconductor epitaxial structure is smaller than that proximate to the second surface of the semiconductor epitaxial structure, and a thickness of the well layer of at least one of the periodic units proximate to the first surface of the semiconductor epitaxial structure is greater than that proximate to the second surface of the semiconductor epitaxial structure.

According to another aspect of the disclosure, the light-emitting device includes a semiconductor epitaxial structure that has a first surface and a second surface opposite to the first surface, and that includes a first semiconductor layer, an active layer, and a second semiconductor layer sequentially stacked on one another in such order from the first surface to the second surface. The active layer includes a quantum well structure having multiple periodic units, each of which includes a well layer and a barrier layer disposed sequentially in such order, and a bandgap of the barrier layer is greater than that of the well layer. A second spacing layer is disposed between the active layer and the second semiconductor layer, and a thickness of the well layer of at least one of said periodic units proximate to the first surface of the semiconductor epitaxial structure is greater than that proximate to the second surface of the semiconductor epitaxial structure. A bandgap of the second spacing layer gradually increases in a direction from the first surface of the semiconductor epitaxial structure to the second surface of the semiconductor epitaxial structure.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 16 is a chart illustrating anti-aging performance of each of a conventional light-emitting device, the first embodiment, and the second embodiment.

DETAILED DESCRIPTION

Figure 1:
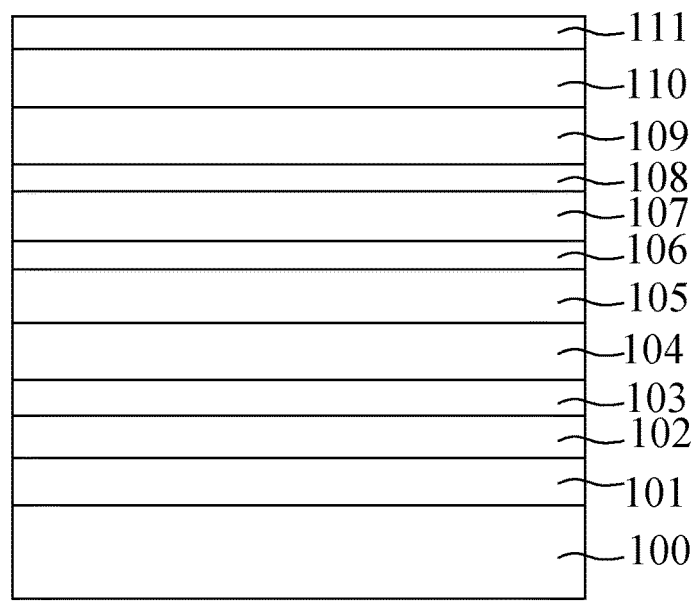
FIG. 1 is a schematic view illustrating an epitaxial structure according to a first embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, an epitaxial structure according to a first embodiment of the disclosure includes a growth substrate 100 and a semiconductor epitaxial structure that includes a first current spreading layer 104, a first cladding layer 105, a first spacing layer 106, an active layer 107, a second spacing layer 108, a second cladding layer 109, a second current spreading layer 110, and a second ohmic contact layer 111 sequentially stacked on one another in such order.

Specifically, referring to FIG. 1, a material for the growth substrate 100 may include, but is not limited to, GaAs, other materials may also be used, such as GaP, InP, etc. In this embodiment, the growth substrate 100 is made of GaAs. In some embodiments, the epitaxial structure of the light-emitting device may further include a buffer layer 101, an etch stop layer 102, and a first ohmic contact layer 103 sequentially disposed in such order between the growth substrate 100 and the first current spreading layer 104. A lattice quality of the buffer layer 101, which is made of GaAs, is better than that of the growth substrate 100; therefore, forming the buffer layer 101 on the growth substrate 100 may reduce adverse effects of lattice defects of the growth substrate 100 on the semiconductor epitaxial structure. The etch stop layer 102 serves to stop etching in later procedures. In certain embodiments, the etch stop layer 102 is an n-type etch stop layer made of n-type GaInP. To facilitate a later removal of the growth substrate 100, the etch stop layer 102 has a thickness that is greater than 0 nm and no greater than 500 nm. In some embodiments, the thickness of the etch stop layer 102 is greater than 0 nm and no greater than 200 nm. The first ohmic contact layer 103 may be made of gallium arsenide, and may have a thickness ranging from 10 nm to 100 nm and a doping concentration ranging from $1E18/cm^3$ to $10E18/cm^3$. In some embodiments, the doping concentration of the first ohmic contact layer 103 is $2E18/cm^3$ so as to achieve better ohmic contact.

The semiconductor epitaxial structure may be formed on the growth substrate 100 by using methods such as physical vapor deposition (PVD), chemical vapor deposition (CVD), epitaxy growth technology, atomic layer deposition (ALD), etc.

The semiconductor epitaxial structure has a first surface and a second surface that is opposite to the first surface, and includes a first semiconductor layer, the active layer 107, and a second semiconductor layer sequentially stacked on one another in such order from the first surface to the second surface. The first semiconductor layer and the second semiconductor layer may be doped with an n-type dopant and a p-type dopant, respectively, to provide electrons and holes, respectively. An n-type semiconductor layer may be doped with n-type dopants such as Si, Ge, or Sn, and a p-type semiconductor layer may be doped with p-type dopants such as Mg, Zn, Ca, Sr, or Ba.

The first semiconductor layer and the second semiconductor layer may be made from a material, such as aluminum gallium indium phosphide, aluminum indium phosphide or aluminum gallium arsenic, and respectively have the first cladding layer 105 and the second cladding layer 109 to provide electrons and holes for the active layer 107. In some embodiments, when the active layer 107 is made of AlGaInP, the first cladding layer 105 and the second cladding layer 109 are made of AlInP and provide the electrons and the holes, respectively. To enhance a uniform current spreading, the first semiconductor layer and the second semiconductor layer further include the first current spreading layer 104 and the second current spreading layer 108, respectively. In some embodiments, to prevents dopants of the first cladding layer 105 and the second cladding layer 109 from spreading into the active layer 107, thereby negatively affecting lattice quality of the active layer 107, a first spacing layer 106 is disposed between the first cladding layer 105 and the active layer 107, and a second spacing layer 108 is disposed between the second cladding layer 109 and the active layer 107.

The first current spreading layer 104 performs a function of current spreading, and effectiveness of the current spreading function is related to a thickness of the first current spreading layer 104. In this embodiment, the first current spreading layer 104 has a composition that is represented by $Al_{y1}Ga_{1-y1}InP$ (y1 ranges from 0 to 1), has a thickness ranging from 2500 nm to 4000 nm, has an n-type doping concentration ranging from $4E17/cm^3$ to $8E17/cm^3$, and is doped with silicon (Si) but is not limited to.

The first spacing layer 106 is disposed between the first cladding layer 105 and the active layer 107. In some embodiment, the first spacing layer 106 has a composition that is represented by $Al_{a1}Ga_{1-a1}InP$, has a thickness no greater than 300 nm, and has a doping concentration no greater than $1E17/cm^3$. A value of a1 ranges from 0.3 to 1.

In this embodiment, the first cladding layer 105 serves to provide electrons for the active layer 107, is made of AlInP, has a thickness ranging from 300 nm to 1500 nm, and is n-type doped with silicon (Si) but is not limited to.

The active layer 107 is a light emitting area for the electrons and the holes to recombine. Depending on a wavelength of light emitted by the active layer 107, materials for the active layer 107 may vary. The active layer 107 may be a single quantum well or multiple quantum wells with a periodic structure. In this embodiment, the active layer 107 includes a quantum well structure having multiple periodic units (i.e., pairs), and each of the periodic units of the quantum well structure includes a well layer and a barrier layer disposed sequentially in such order (i.e., each periodic unit/pair of the quantum well structure includes one well layer and one barrier layer). In addition, a bandgap of the barrier layer is greater than that of the well layer. By adjusting a composition of the semiconductor material of the active layer 107, when the electrons and the holes recombine, the light having a pre-determined wavelength is emitted. The material of the active layer 107, such as InGaAsP or AlGaAs, exhibits electroluminescence property. In some embodiments, the active layer 107 is made of AlGaInP, which may be a single well structure or a multiple quantum well structure. In this embodiment, the semiconductor epitaxial structure is made of AlGaInP or GaAs-based materials, and the active layer 107 emits light having a peak wavelength ranging from 550 nm to 950 nm.

In this embodiment, the quantum well structure (i.e., the active layer 107) has n periodic units (i.e., multiple periodic units), and n ranges from 2 to 100. The well layer has a composition that is represented by $Al_xGa_{1-x}InP$, and the barrier has a composition that is represented by $Al_yGa_{1-y}InP$, where $0 \leq x \leq y \leq 1$, and a value of y of an aluminum content of the barrier layer ranges from 0.3 to 0.85. In certain embodiments, the well layer has a composition that is represented by $In_xGa_{1-x}As$, the barrier layer has a composition that is represented by $In_xGa_{1-y}As$, and $0 \leq x \leq 1$, $0 \leq y \leq 1$. The well layer has a thickness ranging from 5 nm to 25 nm. In some embodiments, the well layer has a thickness ranging from 8 nm to 20 nm. The barrier layer has a thickness ranging from 5 nm to 25 nm. In some embodiments, the barrier layer has a thickness ranging from 10 nm to 20 nm.

In some embodiments, when the light-emitting device is to be used under a condition of a relatively great current density (e.g., no smaller than 2 A/mm²), the number of the periodic units of the quantum well structure ranges from 6 to 50, such as from 12 to 25, so as to meet the needs of saturation current density. Since mobility of the electrons is greater than that of the holes, the electrons tend to cluster near the quantum well structure on the second surface of the semiconductor epitaxial structure, thereby negatively affecting light-emitting efficiency of the light-emitting device. In this embodiment, however, the bandgap of the barrier layer of at least one of the periodic units proximate to the first surface of the semiconductor epitaxial structure is smaller than that proximate to the second surface of the semiconductor epitaxial structure, and the thickness of the well layer of at least one of the periodic units proximate to the first surface of the semiconductor epitaxial structure is greater than that proximate to the second surface of the semiconductor epitaxial structure, which may enhance uniform distribution of the charge carriers in the quantum well structure and reduce concentration of the charge carriers on the second surface of the semiconductor epitaxial structure, thus enhancing the light-emitting efficiency and luminous intensity of the light-emitting device, reducing heat caused by electron overflow, and improving stability and aging performance of light-emitting device.

In some embodiments, bandgaps of the barrier layers of the periodic units gradually increase in a direction from the first surface of the semiconductor epitaxial structure to the second surface of the semiconductor epitaxial structure. In other embodiments, the bandgaps of the barrier layers of the periodic units first increase in a direction from the first surface of the semiconductor epitaxial structure to the second surface of the semiconductor epitaxial structure, then remain constant, and thereafter increase again in the direction. Thicknesses of the well layers of the periodic units first decrease in the direction from the first surface of the semiconductor epitaxial structure to the second surface of the semiconductor epitaxial structure, then remain constant, and thereafter decrease again in the direction. In certain embodiments, a thickness of the well layer of a last one of the periodic units that is proximate to the second surface of the semiconductor epitaxial structure accounts for 50% to 80% of a thickness of the well layer of a first one of the periodic units that is proximate to the first surface of the semiconductor epitaxial structure.

In some embodiments, percentages of aluminum contents of the barrier layers of the periodic units gradually increase in the direction (i.e., a thickness direction) from the first surface of the semiconductor epitaxial structure to the second surface of the semiconductor epitaxial structure. The thicknesses of the well layers gradually decrease in the direction from the first surface of the semiconductor epitaxial structure to the second surface of the semiconductor epitaxial structure. By adjusting composition of the barrier layers in the quantum well structure of the active layer 107, light absorption due to increased thickness of the active layer 107 may be reduced as effect of light absorption is related to attributes of the composition. Furthermore, by adjusting thicknesses of the well layers in the quantum well structure of the active layer 107, distribution of charge carriers in the quantum well structure may be more even, thereby improving the light-emitting efficiency and luminous intensity of the light-emitting device.

Figure 2:
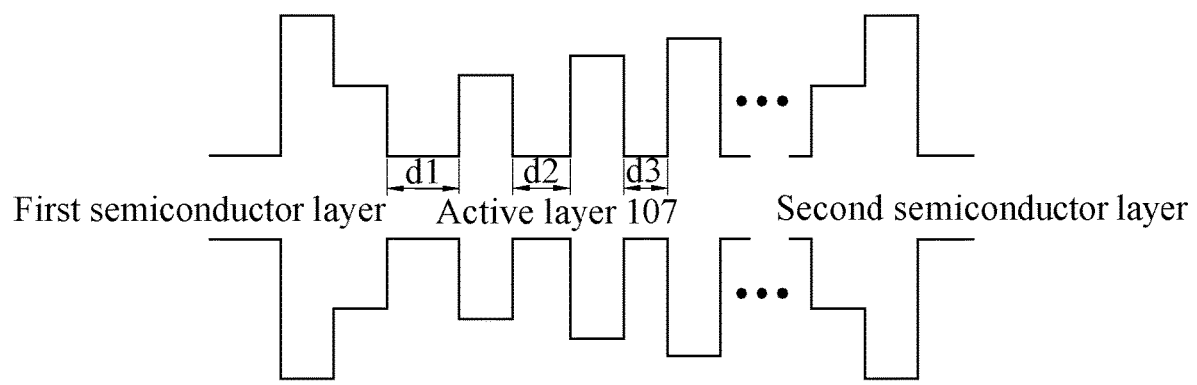
FIGS. 2 and 3 are views each illustrating a bandgap change in an active layer according to the first embodiment of the disclosure.
Figure 3:
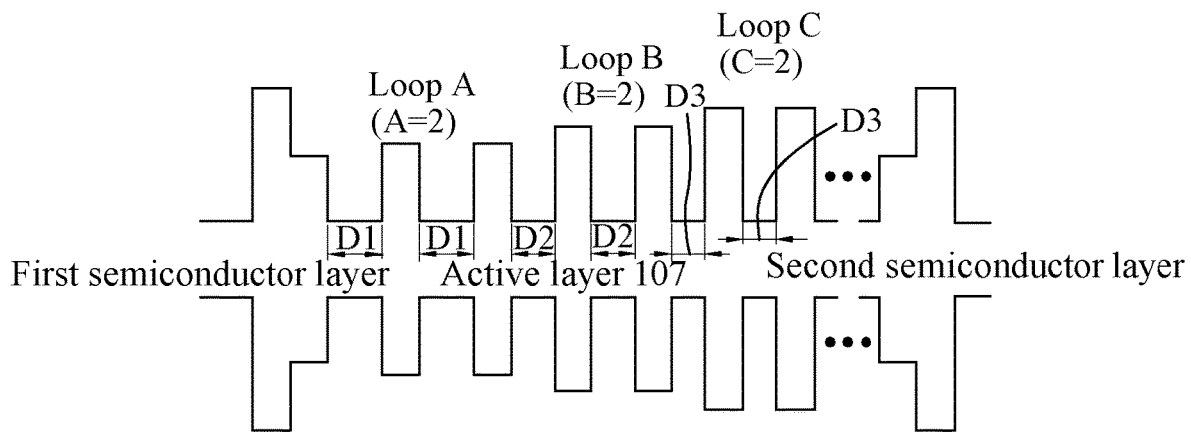

In some embodiments, the aluminum contents of the barrier layers gradually increase in the thickness direction in a linear manner or stepwise manner. The thicknesses of the well layers gradually decrease in the thickness direction in a linear manner or stepwise manner. Specifically, FIGS. 2 and 3 each is a bandgap diagram of the active layer 107. Referring to FIG. 2, percentages of the aluminum contents in the barrier layers of the periodic units gradually increase from a single one of the periodic units to the next single one of the periodic units, or from a group of the periodic units to the next group of the periodic units in the direction from the first semiconductor layer to the second semiconductor layer. The thicknesses of the well layers decrease from a single one of the periodic units to the next single one of the periodic units, or from one group of the periodic units to the next group of the periodic units in the direction from the first semiconductor layer to the second semiconductor layer, wherein d1, d2, and d3 are thicknesses of the well layers of the first periodic unit, the second periodic unit, and the third periodic unit, respectively, and d1>d2>d3. The quantum well structure may be grown in a periodic sequence that includes two or more sequence loops, such that the sequence loops are loop A, loop B, loop C, etc., where A≥2, B≥2, C≥2, etc. (A, B or C represents the number of periodic units in each of the sequence loop). That is to say, the number of periodic units in each of the loop A, B or C is two or more than two so that a group of two or more than two periodic units (i.e., a group of multiple periodic units) of the quantum well structure are produced in each of the loop A, B, or C. The values of A, B and C may be the same or different. Referring to FIG. 3, the sequence loops are loop A, loop B, loop C, etc., where A=2, B=2, C=2, etc. The constituents of the well layers formed in all of the sequence loops A, B, C, etc. are the same. In each sequence loop A, B or C, the aluminum content is not varied so that the aluminum contents of the barrier layers in each group of periodic units are the same. However, the aluminum content is varied or increased when the sequence loops A, B, C are changed from one to another so that the aluminum contents of the barrier layers increase from one group of the periodic units to the other group of the period units in the direction from the first semiconductor layer to the second semiconductor layer. The thickness of the well layer is varied or decreased when the sequence loops A, B, C are changed from one to another so that the thicknesses of the well layers decrease from one group of the periodic units to the other group of the period units in the direction from the first semiconductor layer to the second semiconductor layer, wherein the thicknesses of the well layers of loop A are D1, the thicknesses of the well layers of loop B are D2, the thicknesses of the well layers of loop C are D3, and D1>D2>D3.

To form the barrier layers with the gradually increased aluminum contents, a supply rate of aluminum may be increased in a linear or stepwise manner during the process of growing the quantum well structure. To form the well layers with the gradually decreased thicknesses, a supply rate of a growth material for the well layers may be decreased in a linear or stepwise manner during the process of growing the quantum well structure.

In this embodiment, the number of periodic units of the quantum well structure is 16, and are arranged into four groups each having four periodic units. Each group has four periodic well layers and four periodic barrier layers. The thickness of the well layer of each group may be the same or different. In this embodiment, the thicknesses of the well layers decrease from one group of the periodic units to the next group of the periodic units in the direction from the first semiconductor layer to the second semiconductor layer. The aluminum content of the barrier layer of each group may be the same or different. In this embodiment, the aluminum contents of the barrier layers gradually increase from one group to the other group in the direction from the first semiconductor layer to the second semiconductor layer.

The second spacing layer 108 is disposed between the active layer 107 and the second semiconductor layer, and has a composition that is represented by $Al_zGa_{1-z}InP$. In some embodiments, the second spacing layer 108 has a thickness ($t_0$) no greater than 300 nm and a value of z of aluminum content of the second spacing layer 108 ranges from 0.3 to 1. In certain embodiments, the value of z of the aluminum content of the second spacing layer 108 is greater than 0.5 and smaller than 1, and the second spacing layer 108 has a doping concentration smaller than $1E17/cm^3$. In this embodiment, the second spacing layer 108 has a single-layered structure, and the aluminum content thereof is constant, which is 65%.

The second semiconductor layer includes the second cladding layer 109, the second current spreading layer 110, and the second ohmic contact layer 111. The second cladding layer 109 serves to provide the holes for the active layer 107, may be made of AlInP, has a thickness ranging from 300 nm to 1500 nm, and may be p-type doped with magnesium (Mg) but is not limited to.

The second current spreading layer 110 performs a function of current spreading, and the effectiveness of the current spreading function is related to a thickness of the second current spreading layer 110. The second current spreading layer 110 may have a thickness no smaller than 300 nm and no greater than 12000 nm. In this embodiment, the thickness of the second current spreading layer 110 ranges from 500 nm to 10000 nm. The second current spreading layer 110 may be made of GaP, may be p-type doped having a concentration ranging from $6E17/cm^3$ to $2E18/cm^3$, and may be p-type doped with magnesium (Mg) but is not limited to.

The second ohmic contact layer 111 forms an ohmic contact with a second electrode 204, may be made of GaP, and has a doping concentration no smaller than $1E19/cm^3$. In some embodiments, the doping concentration of the second ohmic contact layer 109 is no smaller than $5E19/cm^3$ so as to achieve better ohmic contact. The second ohmic contact layer 111 has a thickness that is no smaller than 40 nm and no greater than 150 nm. In this embodiment, the thickness of the second ohmic contact layer 111 is 60 nm.

In this embodiment, the percentages of the aluminum contents of the barrier layers increase from the first semiconductor layer to the second semiconductor layer, and the thicknesses of the well layers decrease from the first semiconductor layer to the second semiconductor layer, thereby improving the distribution of charge carriers in the quantum well structure to be more even, and improving the luminous efficiency and luminous intensity of the light-emitting device.

Figure 4:
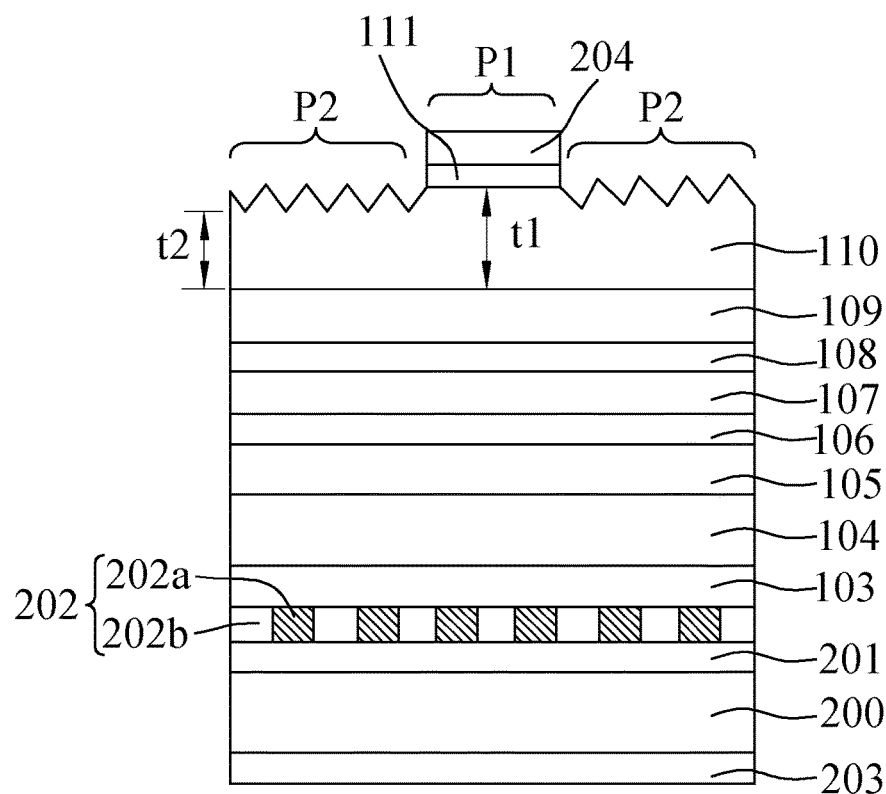
FIG. 4 is a schematic view illustrating a light-emitting device according to the first embodiment of the disclosure.

Referring to FIG. 4, the light-emitting device having the epitaxial structure shown in FIG. 1 includes a substrate 200 and the semiconductor epitaxial structure bonded to the substrate 200 by a bonding layer 201. The semiconductor epitaxial structure includes the first ohmic contact layer 103, the first current spreading layer 104, the first cladding layer 105, the first spacing layer 106, the active layer 107, the second spacing layer 108, the second cladding layer 109, the second current spreading layer 110, and the second ohmic contact layer 111 sequentially stacked in such order on the substrate 200.

The substrate 200 is a conductive substrate and may be made of silicon, silicon carbide, or a metal. Examples of the metal include copper, tungsten, molybdenum, etc. In some embodiments, the substrate 200 has a thickness no smaller than 50 μm so as to have sufficient mechanical strength to support the semiconductor epitaxial structure. In addition, to facilitate further mechanical processing of the substrate 200 after bonding the substrate 200 to the semiconductor epitaxial structure, the thickness of the substrate 200 may be no greater than 300 km. In this embodiment, the substrate 200 is a copper substrate.

The second electrode 204 is disposed on the second ohmic contact layer 111. The second electrode 204 and the second ohmic contact layer 111 form an ohmic contact to allow an electric current to pass therethrough. During formation of the light-emitting device, the second ohmic contact layer 111 is etched to maintain a portion of the second ohmic contact layer 111 located right below the second electrode 204. The second current spreading layer 110 includes two portions in a horizontal direction perpendicular to the bottom-top direction: a first portion (P1) that is located right below the second ohmic contact layer 111 and the second electrode 204 (i.e., the portion covered by the second ohmic contact layer 111 and the second electrode 204), and a second portion (P2) that is not located right below the second electrode 204 (i.e., the portion not covered by the second ohmic contact layer 111 and the second electrode 204). The second portion (P2) has a light-exiting surface that is not covered by and exposed from the second ohmic contact layer 111 and the second electrode 204. The light-exiting surface may surround the second electrode 204 and be a patterned surface or a roughened surface obtained via etching. The roughened surface may have a regular or an arbitrarily irregular micro/nanostructure. The light-exiting surface that is patterned or roughened facilitates an exit of light, so as to increase the luminous efficiency of the light-emitting device. In some embodiments, the light-exiting surface for exiting light emitted by the active layer 107 is a roughened surface that has a roughened structure with a height difference (between the peak and the valley of the roughened structure) of less than 1 m, e.g., from 10 nm to 300 nm.

Of the second current spreading layer 110, the first portion (P1) has a contact surface that is in contact with the second ohmic contact layer 111 The contact surface is not roughened because the contact surface is protected by the second electrode 204. The roughened surface of second portion (P2) of the second current spreading layer 110 is relatively lower than the contact surface of the first portion (P1) on a horizontal level.

Specifically, as shown in FIG. 4, in this embodiment, the first portion (P1) has a first thickness (t1), and the second portion (P2) has a second thickness (t2). In certain embodiments, the first thickness (t1) ranges from 1.5 μm to 2.5 μm, and the second thickness (t2) ranges from 0.5 μm to 1.5 μm. The first thickness (t1) of the first portion (P1) is greater than the second thickness (t2) of the second portion (P2). In some embodiments, the first thickness (t1) is greater than the second thickness (t2) by at least 0.3 μm.

The light-emitting device may further include a mirror layer 202 that is disposed between the semiconductor epitaxial structure and the substrate 200. The mirror layer 202 includes an ohmic contact metal layer 202a and a dielectric layer 202b. On one hand, the ohmic contact metal layer 202a and the dielectric layer 202b cooperate with the first ohmic contact layer 103 to form an ohmic contact. On the other hand, the ohmic contact metal layer 202a and the dielectric layer 202b reflect the light emitted by the active layer 107 toward the light-exiting surface of the second current spreading layer 110 or a side wall of the semiconductor epitaxial structure so as to facilitate the exit of light.

The light-emitting device further includes a first electrode 203. In some embodiments, the first electrode 203 is disposed on the substrate 200 at a side where the semiconductor epitaxial structure is disposed or at a side where the semiconductor epitaxial structure is not disposed.

Each of the first electrode 203 and the second electrode 204 may be made of a transparent conductive material or a metal material. The transparent conductive material may be indium tin oxide (ITO) or indium zinc oxide (IZO). The metal material may be GeAuNi, AuGe, AuZn, Au, Al, Pt, and Ti, and combinations thereof.

To improve the reliability of the light-emitting device, surfaces and side walls of the light-emitting device are covered with an insulation layer (not shown). The insulation layer may be a single-layered or multilayered structure, and composed of at least one material of $SiO_2$, $SiN_x$, $Al_2O_3$, and $Ti_3O_5$.

The light-emitting device of the disclosure may improve the distribution of charge carriers in the quantum well structure to be more even, and may reduce concentration of the charge carriers on the second surface of the semiconductor epitaxial structure, thereby improving the light-emitting efficiency, luminous intensity, stability, and anti-aging performance of the light-emitting device. Referring to FIG. 16, a single chip of the light-emitting device having a size of 2175 μm*1355 μm was packaged and subjected to a multi-point anti-aging test. Under a fixed current of 11 A, luminous flux attenuation levels were tested at different points of time. After being subjected to the anti-aging test for four hours, light attenuation of the light-emitting device of the first embodiment is 7.9%, approximately 10% lower compared to the light attenuation of a conventional light-emitting device, which is 17.5%.

Compared with the epitaxial structure of the first embodiment shown in FIG. 1, in the second embodiment of the disclosure, the aluminum content of the second spacing layer 108 gradually increases in the direction from the first semiconductor layer to the second semiconductor layer. In some embodiments, the aluminum content of the second spacing layer 108 gradually increases in the direction from the first semiconductor layer to the second semiconductor layer in a linear manner or a stepwise manner.

Figure 5:
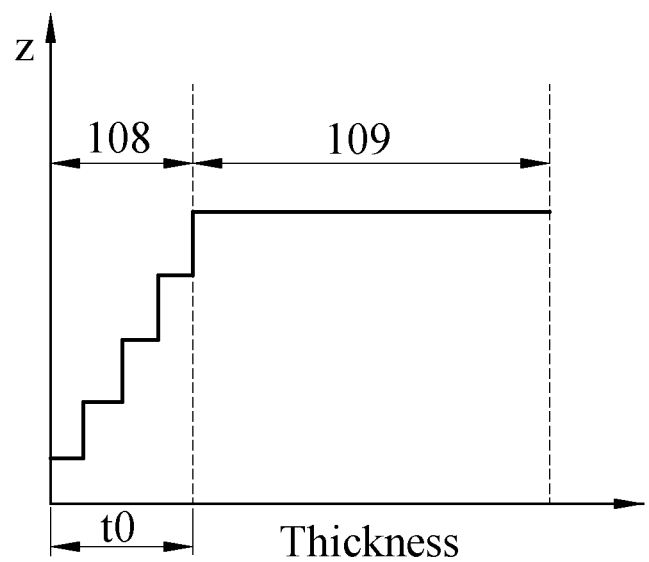
FIGS. 5 and 6 are graphs illustrating an aluminum content of a second spacing layer according to a second embodiment of the disclosure.
Figure 6:
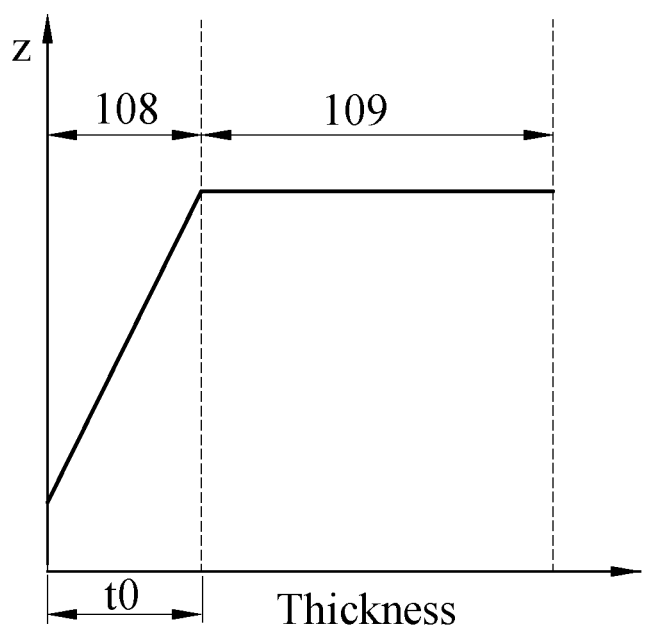

Specifically, referring to FIG. 5, the second spacing layer 108 may have a multilayered structure, such as having two layers or more (e.g., having a first layer, a second layer to an $n^{th}$ layer, wherein n>=3), and has a composition that is represented by $Al_zGa_{1-z}InP$, wherein a value of z of the first layer is x1, the value of z of the second layer is x2, the value of z of the third layer is x3, etc., and x1<x2<x3, such that the value of z is increased in a stepwise manner. In certain embodiments, referring to FIG. 6, the second spacing layer 108 may have a single-layered structure, and the aluminum content thereof increases in a linear manner in the thickness direction.

To form the second spacing layer 108 with the gradually increased aluminum contents, a supply rate of aluminum may be increased in a linear or stepwise manner during the process of growing the quantum well structure.

By having the quantum well structure of the first embodiment, and by having the aluminum contents of the second spacing layer 108 increasing in the direction from the first semiconductor layer to the second semiconductor layer, the light-emitting device of the second embodiment may reduce overflow of the charge carriers, thereby improving stability and anti-aging performance of the light-emitting device. Referring to FIG. 16, a single chip of the light-emitting device of this embodiment having a size of 2175 μm*1355 μm was packaged and subjected to a multi-point anti-aging test. Under a fixed current of 11 A, after being subjected to the anti-aging test for four hours, light attenuation of the light-emitting device of the second embodiment is 1.5%, approximately 16% lower compared to the light attenuation of the conventional light-emitting device, which is 17.5%.

Figure 17:
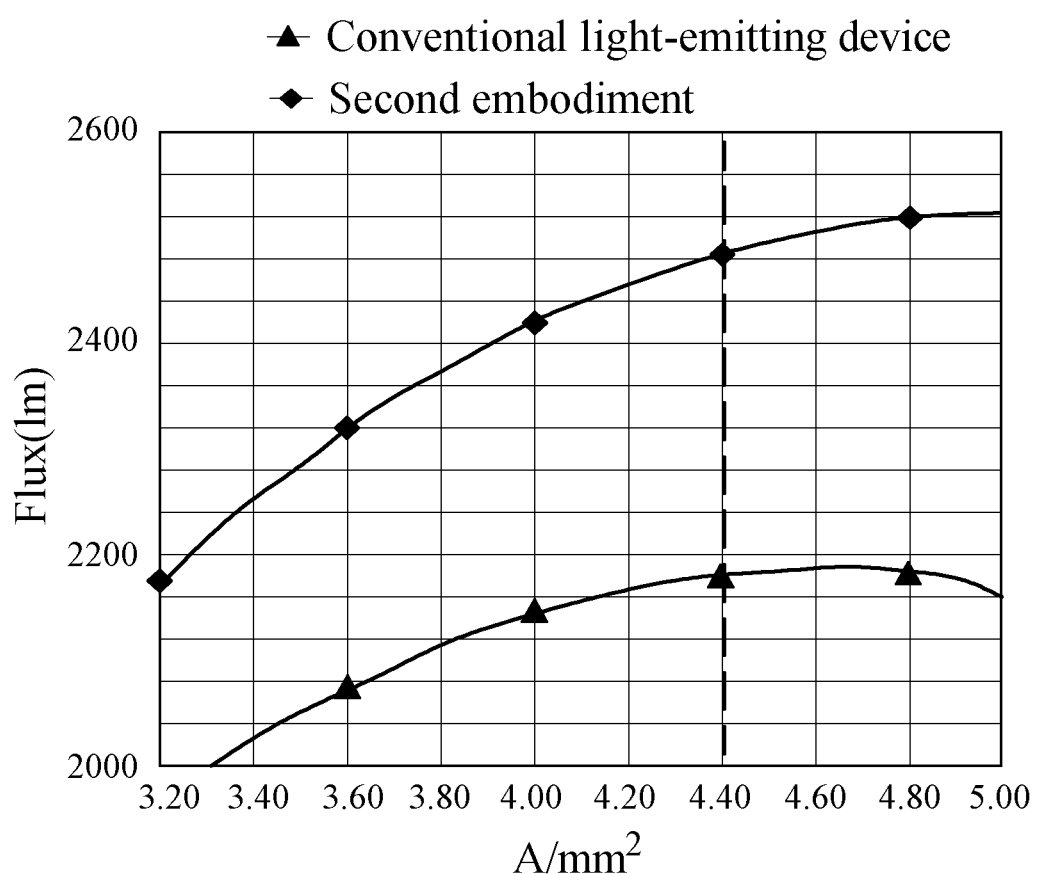
FIG. 17 is a graph illustrating the relationship between current density and flux for each of the conventional light-emitting device and the light-emitting device of the second embodiment.

Referring to FIG. 17, a single chip of the light-emitting device having a size of 2175 μm*1355 μm was packaged and subjected to a test for investigating variation of luminous flux with current density (J). When the current density was 4.4 A/mm², the luminous flux of the light-emitting device of the disclosure (i.e., 2485 lm) was 13.9% higher than that of a conventional light-emitting device (i.e., 2180 lm).

By having a bandgap of the second spacing layer 108 gradually increasing from the first semiconductor layer to the second semiconductor layer, overflowing of the charge carriers may be reduced, thereby improving the light-emitting efficiency, luminous intensity, stability, and anti-aging performance of the light-emitting device.

Figure 7:
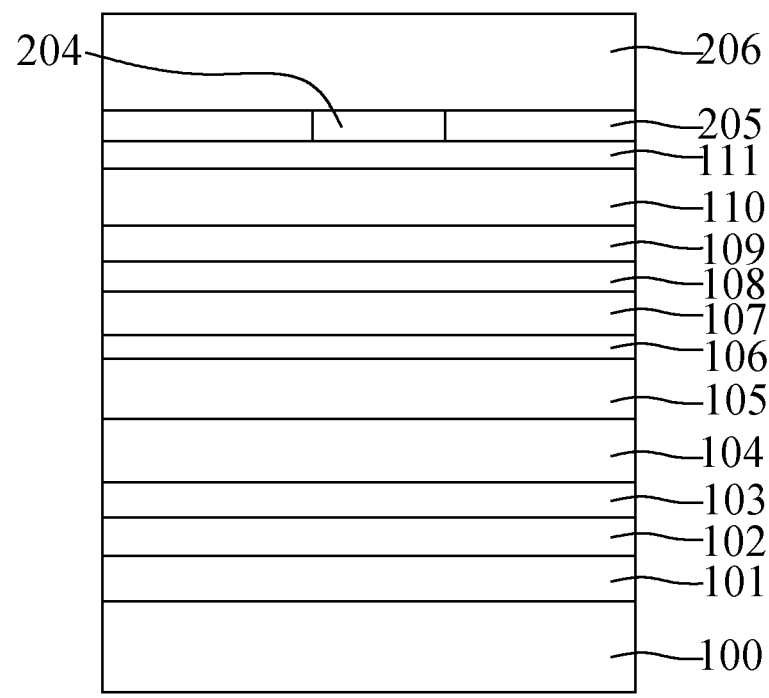
FIGS. 7 to 9 are schematic views illustrating a manufacturing method according to a third embodiment of the disclosure, which produces the light-emitting device of the second embodiment.
Figure 8:
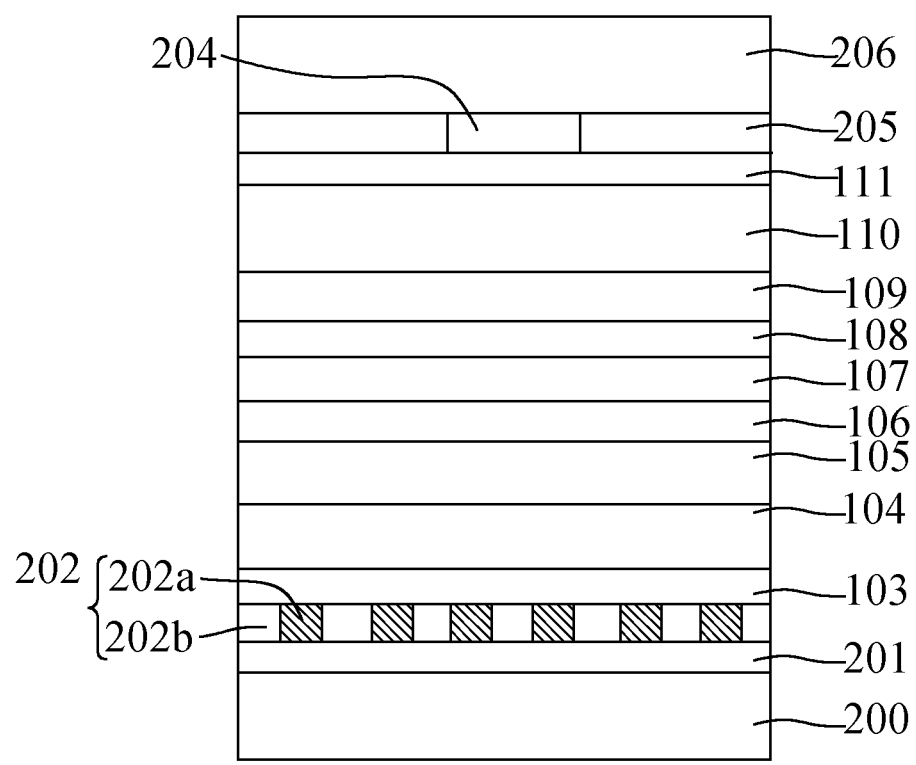
Figure 9:
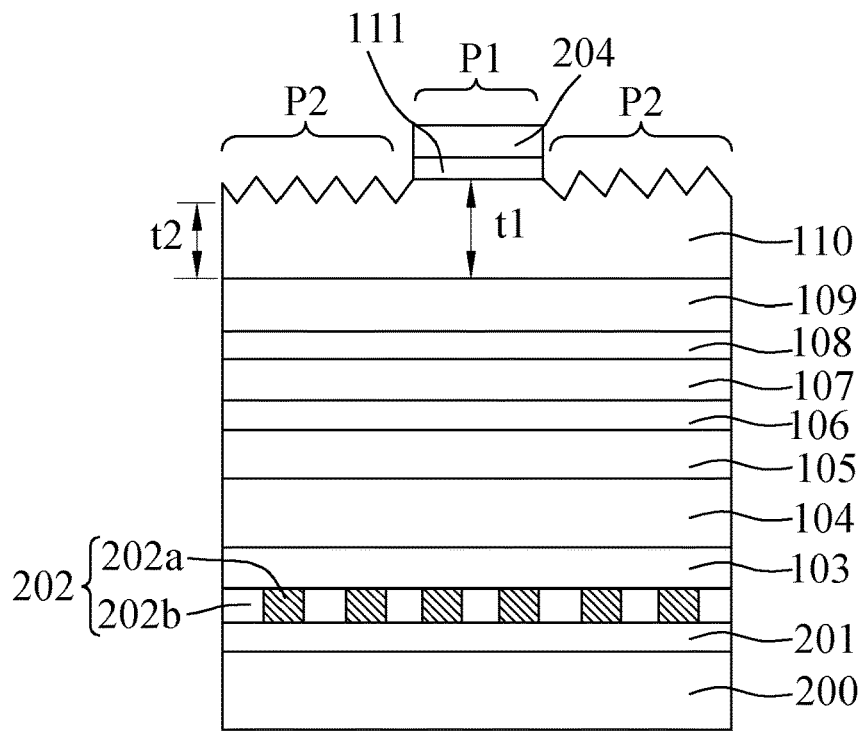

Referring to FIGS. 7 to 9, a method for manufacturing the light-emitting device of the second embodiment is provided below.

First, the growth substrate 100 (e.g., made of GaAs) is provided. By using an epitaxy process, such as metal-organic chemical vapor deposition (MOCVD), the semiconductor epitaxial structure is grown on the growth substrate 100. The semiconductor epitaxial structure includes the buffer layer 101, the etch stop layer 102 for removing the growth substrate 100, the first ohmic contact layer 103, the first current spreading layer 104, the first cladding layer 105, the first spacing layer 106, the active layer 107, the second spacing layer 108, the second cladding layer 109, the second current spreading layer 110, and the second ohmic contact layer 111 sequentially stacked in such order on the growth substrate 100.

In this embodiment, the first current spreading layer 104 has a composition that is represented by $Al_{y1}Ga_{1-y1}InP$, has a thickness ranging from 2500 nm to 4000 nm, and is n-type doped having a concentration ranging from $4E17/cm^3$ to $8E17/cm^3$. The first cladding layer 105 serves to provide electrons for the active layer 107, may be made of AlInP, has a thickness ranging from 300 nm to 1500 nm, and is n-type doped with silicon (Si) but is not limited to.

The first spacing layer 106 may have a composition that is represented by $Al_{a1}Ga_{1-a1}InP$, wherein a value of a1 of the aluminum content ranges from 0.3 to 1, may have a thickness no greater than 300 nm, and may have a doping concentration no greater than $1E17/cm^3$.

The active layer 107 has the multiple quantum well structure, which is made by repeatedly stacking the well layer that has a composition represented by $Al_xGa_{1-x}InP$ and the barrier layer that has a composition represented by $Al_yGa_{1-y}InP$, wherein 0≤x≤y1.

In this embodiment, the number of periodic units of the quantum well structure is 16, and are arranged into four groups each having four periodic units that have four periodic well layers and four periodic barrier layers. The thicknesses of the well layers of each group may be the same or different. The aluminum contents of the barrier layers of each group may be the same or different. The thicknesses of the well layers decrease from a single one of the periodic units to the next single one of the periodic units, or from one group of the periodic units to the next group of the periodic units in the direction from the first surface of the semiconductor epitaxial structure to the second surface of the semiconductor epitaxial structure. The percentages of aluminum contents in the barrier layers of the periodic units gradually increase from a single one of the periodic units to the next single one of the periodic units, or from a group of the periodic units to the next group of the periodic units in the direction from the first surface of the semiconductor epitaxial structure to the second surface of the semiconductor epitaxial structure.

The second spacing layer 108 has a composition that is represented by $Al_zGa_{1-z}InP$. The value of z of the aluminum content in the second spacing layer 108 increases in the direction from the first surface of the semiconductor epitaxial structure to the second surface of the semiconductor epitaxial structure in one of a linear manner and a stepwise manner. In some embodiments, the second spacing layer 108 has a thickness no greater than 300 nm and the value of z of the aluminum content in the second spacing layer 108 ranges from 0.3 to 1. In certain embodiments, the second spacing layer 108 has a doping concentration smaller than $1E17/cm^3$.

The second cladding layer 109 serves to provide holes for the quantum well structure, may be made of AlInP, has the thickness ranging from 300 nm to 1500 nm, and may be p-type doped with magnesium (Mg) but is not limited to.

The second current spreading layer 110 performs a function of current spreading, and the effectiveness of the current spreading function is related to the thickness of the second current spreading layer 110. In this embodiment, the thickness of the second current spreading layer 110 ranges from 500 nm to 10000 nm. The second current spreading layer 110 may be made of GaP, may be p-type doped having a concentration ranging from $6E17/cm^3$ to $2E18/cm^3$, and may be p-type doped with magnesium (Mg) but is not limited to.

The second ohmic contact layer 111 forms an ohmic contact with the second electrode 204, may be made of GaP, and has a doping concentration no smaller than $1E19/cm^3$. In some embodiments, the doping concentration of the second ohmic contact layer 109 is no smaller than $5E19/cm^3$ so as to achieve better ohmic contact. The second ohmic contact layer 111 has a thickness that is no smaller than 40 nm and no greater than 150 nm. In this embodiment, the thickness of the second ohmic contact layer 111 is 60 nm.

Next, referring to FIG. 7, the second electrode 204 is formed on the second ohmic contact layer 111. The semiconductor epitaxial structure is bonded to a temporary substrate 206 using a bonding glue 205. In certain embodiments, the bonding glue is a BCB glue; the temporary substrate 206 is a glass substrate.

Then, the growth substrate 100, the buffer layer 101, and the etch stop layer 102 are removed using wet etching to reveal the first ohmic contact layer 103. The mirror layer 202 is formed on the first ohmic contact layer 103 opposite to the first current spreading layer 104. The mirror layer 202 includes the ohmic contact metal layer 202a and the dielectric layer 202b, both of which cooperate to form the ohmic contact with the first ohmic contact layer 103. On the other hand, the ohmic contact metal layer 202a and the dielectric layer 202b reflect the light emitted by the active layer 107. On the other hand, the ohmic contact metal layer 202a and the dielectric layer 202b reflect the light emitted by the active layer 107. Next, the substrate 200 is provided, which is bonded with the mirror layer 202 through the bonding layer 201 to obtain a structure shown in FIG. 8.

Then, the temporary substrate 206 is removed by wet etching. A mask (not shown) is formed to cover the second electrode 204, and the second ohmic contact layer 111 that is not covered by and surrounds the second electrode 204 is left exposed. Etching is performed to remove the second ohmic contact layer 111 surrounding the second electrode 204 so that the second ohmic contact layer 111 not located right below the second electrode 204 is completely removed so as to reveal the second current spreading layer 110. The second current spreading layer 110 is etched to form a patterned or roughened surface so as to form a structure shown in FIG. 9. The removal of the second ohmic contact layer 111 and the roughening of the second current spreading layer 108 may be conducted by wet etching in one step or multiple steps. Solutions used for wet etching may be acidic, such as hydrochloric acid, sulfuric acid, hydrofluoric acid, citric acid, or other chemical reagents Finally, the first electrode 203 is formed on a surface of the substrate 200 opposite to the bonding layer 201, as shown in FIG. 4. Depending on requirements, processes such as etching or dicing are performed to obtain a plurality of unitized light-emitting devices.

Figure 10:
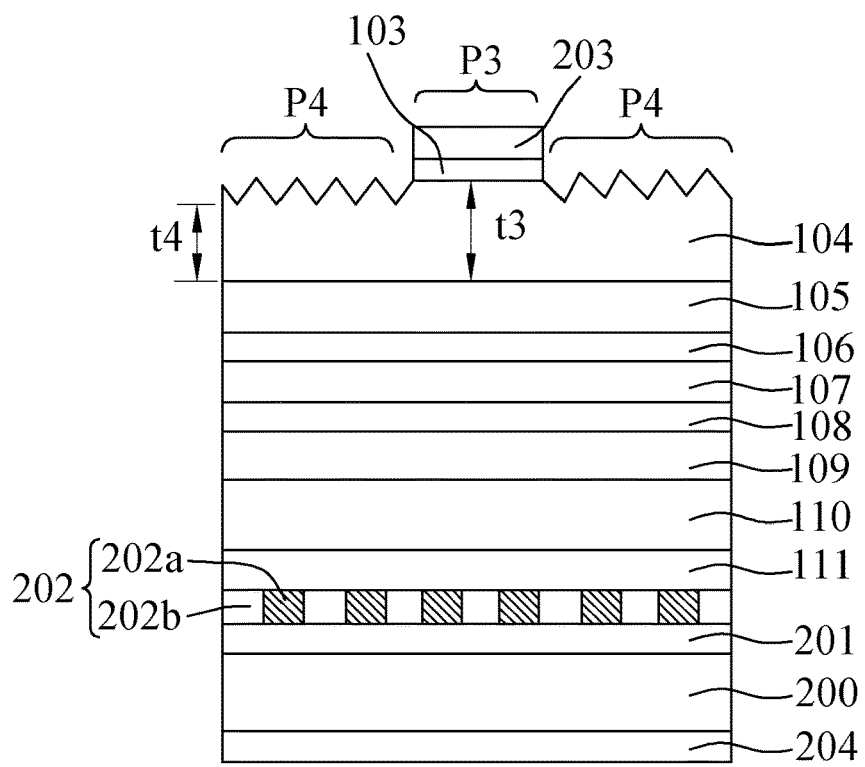
FIG. 10 is a schematic view illustrating the light-emitting device according to a fourth embodiment of the disclosure.

FIG. 10 illustrates a light-emitting device according to a fourth embodiment of the disclosure, which has the epitaxial structure shown in the second embodiment, and includes the substrate 200 and the semiconductor epitaxial structure bonded to the substrate 200 by the bonding layer 201. The semiconductor epitaxial structure includes the second ohmic contact layer 111, the second current spreading layer 110, the second cladding layer 109, the second spacing layer 108, the active layer 107, the first spacing layer 106, the first cladding layer 105, the first current spreading layer 104, and the first ohmic contact layer 103 sequentially stacked on the substrate 200.

The substrate 200 is a conductive substrate and may be made of silicon, silicon carbide, or a metal. Examples of the metal include copper, tungsten, molybdenum, etc. In some embodiments, the substrate 200 has a thickness no smaller than 50 μm so as to have sufficient mechanical strength to support the semiconductor epitaxial structure. In addition, to facilitate further mechanical processing of the substrate 200 after bonding the substrate 200 to the semiconductor epitaxial structure, the substrate 200 may have a thickness that is no greater than 300 μm. In this embodiment, the substrate 200 is a silicon substrate.

The first electrode 203 is disposed on the first ohmic contact layer 103. The first electrode 203 and the first ohmic contact layer 103 form an ohmic contact to allow an electric current to pass therethrough. During formation of the light-emitting device, the first ohmic contact layer 103 is etched to maintain a portion of the first ohmic contact layer 103 located right below the first electrode 203. The first current spreading layer 104 includes two portions in a horizontal direction perpendicular to the bottom-top direction: a third portion (P3) that is located right below the first ohmic contact layer 103 and the first electrode 203 (i.e., the portion covered by the first ohmic contact layer 103 and the first electrode 203), and a fourth portion (P4) that is not located right below the first electrode 203 (i.e., the portion not covered by the first ohmic contact layer 103 and the first electrode 203). The fourth portion (P4) has a light-exiting surface that is not covered by and exposed from the first ohmic contact layer 103 and the first electrode 203. The light-exiting surface may surround the first electrode 203 and be a patterned surface or a roughened surface obtained via etching. The roughened surface may have a regular or an arbitrarily irregular micro/nanostructure. The light-exiting surface that is patterned or roughened facilitates an exit of light, so as to increase the luminous efficiency of the light-emitting device. In some embodiments, the light-exiting surface is a roughened surface that has a roughened structure with a height difference (between the peak and the valley of the roughened structure) of less than 1 m, e.g., from 10 nm to 300 nm.

Of the first current spreading layer 104, the third portion (P3) has a contact surface that is in contact with the first ohmic contact layer 103. The contact surface is not roughened because the contact surface is protected by the first electrode 203. The roughened surface of fourth portion (P4) of the first current spreading layer 104 is relatively lower than the contact surface of the third portion (P3) on a horizontal level.

Specifically, as shown in FIG. 10, in this embodiment, the third portion (P3) has a third thickness (t3), and the fourth portion (P4) has a fourth thickness (t4). In certain embodiments, the third thickness (t3) ranges from 1.5 µm to 2.5 µm, and the fourth thickness (t4) ranges from 0.5 µm to 1.5 µm. The third thickness (t3) of the third portion (P3) is greater than the fourth thickness (t4) of the fourth portion (P4). In some embodiments, the third thickness (t3) is greater than the fourth thickness (t4) by at least 0.3 µm.

The light-emitting device may further include the mirror layer 202 that is disposed between the semiconductor epitaxial structure and the substrate 200. The mirror layer 202 includes the ohmic contact metal layer 202a and the dielectric layer 202b. On one hand, the ohmic contact metal layer 202a and the dielectric layer 202b cooperate with the second ohmic contact layer 111 to form an ohmic contact. On the other hand, the ohmic contact metal layer 202a and the dielectric layer 202b reflect the light emitted by the active layer 107 toward the light-exiting surface of the first current spreading layer 104 or a side wall of the semiconductor epitaxial structure so as to facilitate the exit of light.

The light-emitting device further includes the second electrode 204 disposed on the substrate 200 at a side where the semiconductor epitaxial structure is disposed or at a side opposite to the semiconductor epitaxial structure.

Each of the first electrode 203 and the second electrode 204 may be made of a transparent conductive material or a metal material. The transparent conductive material may be indium tin oxide (ITO) or indium zinc oxide (IZO). The metal material may be GeAuNi, AuGe, AuZn, Au, Al, Pt, and Ti, and combinations thereof.

Figure 11:
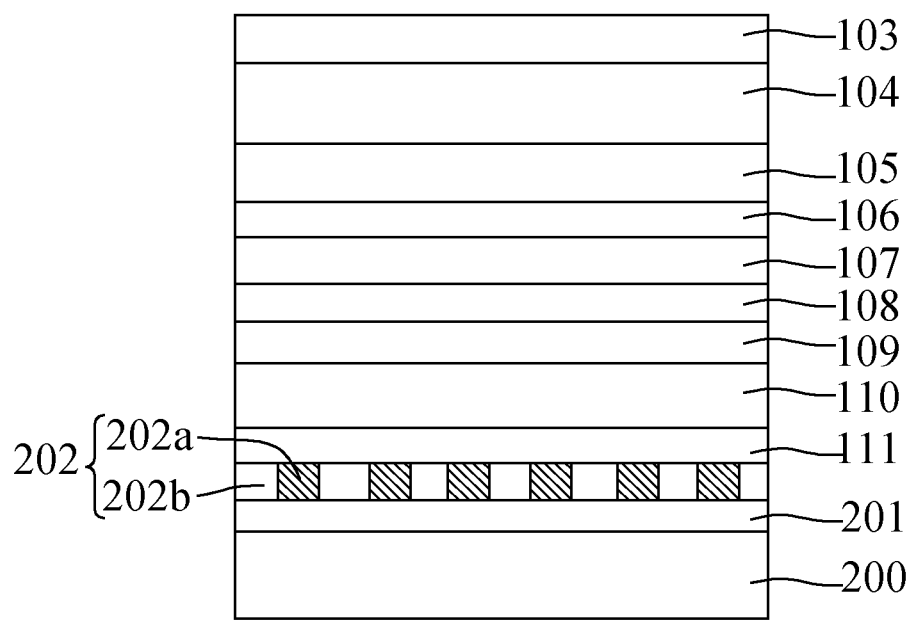
FIGS. 11 and 12 are schematic views illustrating a manufacturing method according to a fifth embodiment of the disclosure, which produces the light-emitting device of the fourth embodiment.
Figure 12:
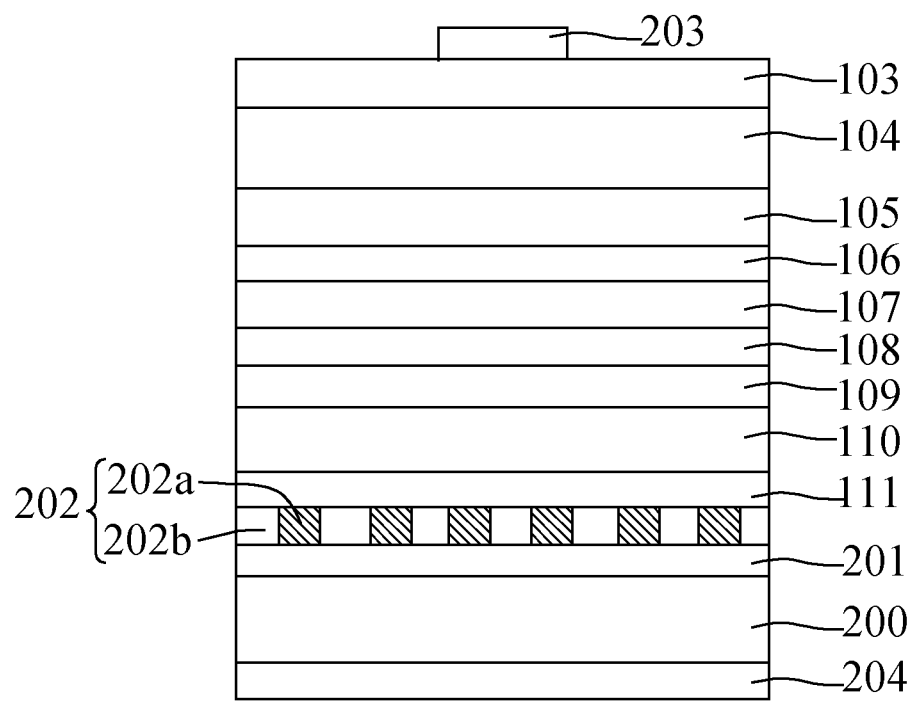

Referring to FIGS. 11 to 12, a fourth embodiment of the disclosure including a method for manufacturing the light-emitting device of the third embodiment is provided below.

First, the growth substrate 100 is provided. By using an epitaxy process, such as metal-organic chemical vapor deposition (MOCVD), the semiconductor epitaxial structure is grown on the growth substrate 100. The semiconductor epitaxial structure includes the buffer layer 101, the etch stop layer 102 for removing the growth substrate 100, the first ohmic contact layer 103, the first current spreading layer 104, the first cladding layer 105, the first spacing layer 106, the active layer 107, the second spacing layer 108, the second cladding layer 109, the second current spreading layer 110, and the second ohmic contact layer 111 sequentially stacked in such order on the growth substrate 100.

Next, the semiconductor epitaxial structure is transferred onto the substrate 200 and the growth substrate 100 is removed to obtain a structure as shown in FIG. 11. The steps include: forming the mirror layer 202 on the second ohmic contact layer 111, where the mirror layer 202 includes the ohmic contact metal layer 202a and the dielectric layer 202b; providing the substrate 200; disposing the bonding layer 201 on the substrate 200; bonding the substrate 200 with the mirror layer 202 through the bonding layer 201; and removing the growth substrate 100. In cases where the growth substrate 100 is made of gallium arsenide, the growth substrate may be removed by wet etching until the first ohmic contact layer 103 is revealed.

Next, referring to FIG. 12, the first electrode 203 is formed on the first ohmic contact layer 103 so a good ohmic contact is established between the first electrode 203 and the first ohmic contact layer 103, and the second electrode 204 is formed on the substrate 200 opposite to the semiconductor epitaxial structure. A conductive current may then pass through the first electrode 203, the second electrode 204, and the semiconductor epitaxial structure. In addition, the substrate 200 has a pre-determined thickness that is capable of supporting the semiconductor epitaxial structure.

Then, a mask (not shown) is formed to cover the first electrode 203, and a portion of the first ohmic contact layer 103 that is not covered by and surrounds the first electrode 203 is left exposed. Next, etching is performed to remove the portion of the first ohmic contact layer 103 that is left exposed, so that the first ohmic contact layer 103 not located right below the first electrode 203 is completely removed so as to reveal the first current spreading layer 104. Afterwards, the first current spreading layer 104 is etched to form a patterned or roughened surface as shown in FIG. 10. It should be noted that the removal of the first ohmic contact layer 103 and the roughening of the first current spreading layer 104 may be conducted by wet etching in one step or multiple steps. Solutions used for wet etching may be acidic, such as hydrochloric acid, sulfuric acid, hydrofluoric acid, citric acid, or other chemical reagents.

Finally, depending on requirements, processes such as etching or dicing are performed to obtain a plurality of unitized light-emitting devices.

Figure 13:
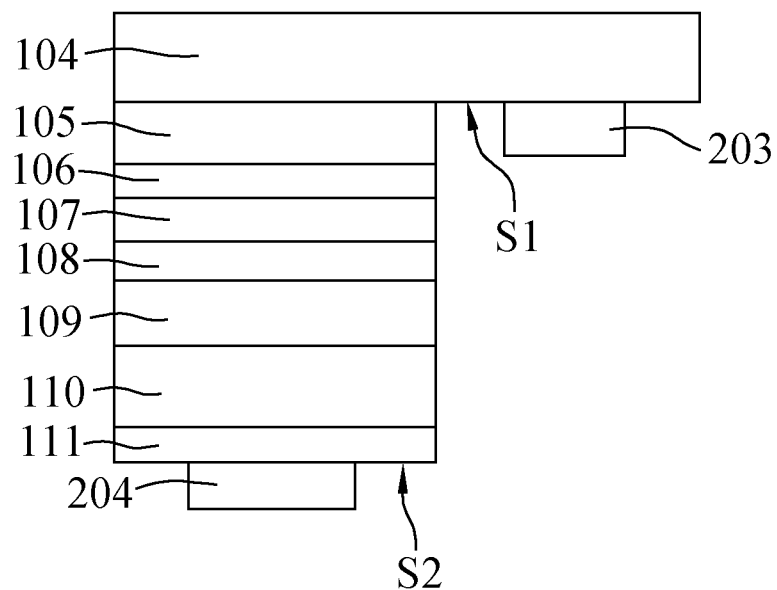
FIG. 13 is a schematic view illustrating a micro light-emitting device according to a sixth embodiment of the disclosure.

FIG. 13 illustrates a light-emitting device according to a sixth embodiment of the disclosure, which is a micro light-emitting device having the epitaxial structure shown in FIG. 1. The micro light-emitting device includes the semiconductor epitaxial structure that includes the first semiconductor layer, the active layer 107, and the second semiconductor layer sequentially stacked on one another in such order, a first mesa (S1) formed by the first semiconductor layer, a second mesa (S2) formed by the second semiconductor layer, the first electrode 203 formed on the first mesa (S1) and electrically connected to the first semiconductor layer, and the second electrode 204 formed on the second mesa (S2) and electrically connected to the second semiconductor layer.

In this embodiment, the first semiconductor layer includes the first current spreading layer 104, the first cladding layer 105, and the first spacing layer 106, wherein the first current spreading layer 104 performs a function of current spreading, and the effectiveness of the current spreading function is related to a thickness of the first current spreading layer 104. In this embodiment, the first current spreading layer 104 has a composition that is represented by $Al_{y1}Ga_{1-y1}InP$, has a thickness ranging from 2500 nm to 5000 nm, and has an n-type doping concentration ranging from $2E18/cm^3$ to $5E18/cm^3$. The value of $y_1$ ranges from 0.3 to 0.7 so as to ensure light transmission of the current spreading layer 104. The first current spreading layer 104 is electrically connected to and forms an ohmic contact with the first electrode 203. A surface of the first current spreading layer 104 away from the active layer 107 is a light-exiting surface. The first cladding layer 105 provides the electrons for the quantum well structure, is made of AlInP, has a thickness ranging from 200 nm to 1200 nm, and is doped with silicon but is not limited to. The first spacing layer 106 is disposed between the first cladding layer 105 and the active layer 107, has a composition that is represented by $Al_{a1}Ga_{1-a1}InP$, and has a thickness no greater than 300 nm and a doping concentration no greater than $1E17/cm^3$. The value of a1 ranges from 0.3 to 1.

The second semiconductor layer includes the second spacing layer 108, the second cladding layer 109, the second current spreading layer 110, and the second ohmic contact layer 111. The second spacing layer 108 is disposed between the active layer 107 and the second cladding layer 109. The second spacing layer 108 has a composition that is represented by $Al_zGa_{1-z}InP$. The aluminum content of the second spacing layer 108 gradually increases in the direction from the first semiconductor layer to the second semiconductor layer in a linear manner or a stepwise manner. The second spacing layer 108 has a thickness no greater than 300 nm and a doping concentration no greater than $1E17/cm^3$. The value of z ranges from 0.3 to 1.

The second cladding layer 109 provides the holes for the quantum well structure, is made of AlInP, has a thickness ranging from 200 nm to 1200 nm, and is p-type doped with magnesium (Mg) but is not limited to.

The second current spreading layer 110 performs a function of current spreading, and the effectiveness of the current spreading function is related to a thickness of the second current spreading layer 110. In this embodiment, the thickness of the second current spreading layer 110 may vary based on the size of the light-emitting device, and the thickness of the second current spreading layer 110 is no smaller than 200 nm and no greater than 1500 nm. In this embodiment, the second current spreading layer 110 has a thickness ranging from 300 nm to 1000 nm, is made of GaP, has a doping concentration ranging from $9E17/cm^3$ to $4E18/cm^3$, and is doped with carbon but is not limited to.

The second ohmic contact layer 111 covers the second current spreading layer 110, may be made of GaP, may have a thickness ranging from 30 nm to 100 nm, and may have a doping concentration ranging from $5E18/cm^3$ to $5E19/cm^3$. In some embodiments, the second ohmic contact layer 111 has a doping concentration of $9E18/cm^3$, and is electrically connected to and forms a good ohmic contact with the second electrode 204.

The active layer 107 has the multiple quantum well structure, which is made by repeatedly stacking the well layer that has a composition represented by $Al_xGa_{1-x}InP$ and the barrier layer that has a composition represented by $Al_yGa_{1-y}InP$, wherein $0 \leq x \leq y \leq 1$. Specifically, in this embodiment, the number of periodic units of the quantum well structure ranges from 2 to 20. In other embodiments, the number of periodic units of the quantum well structure ranges from 2 to 16. The bandgap of the barrier layer of at least one of the periodic units proximate to the first surface of the semiconductor epitaxial structure is smaller than that proximate to the second surface of the semiconductor epitaxial structure, and the thickness of the well layer of at least one of the periodic units proximate to the first surface of the semiconductor epitaxial structure is greater than that proximate to the second surface of the semiconductor epitaxial structure. The percentages of aluminum contents in the barrier layers of the periodic units gradually increase in the direction from the first surface of the semiconductor epitaxial structure to the second surface of the semiconductor epitaxial structure. The thicknesses of the well layers of the periodic units gradually decrease in the direction from the first surface of the semiconductor epitaxial structure to the second surface of the semiconductor epitaxial structure. The aluminum contents the barrier layers increase from one periodic unit to the other periodic unit in the direction from the first semiconductor layer to the second semiconductor layer. The thicknesses of the well layers decrease from a single one of the periodic units to the next single one of the periodic units in the direction from the first semiconductor layer to the second semiconductor layer. In some embodiments, the thickness of the well layer ranges from 3 nm to 7 nm, and the thickness of the barrier layer ranges from 4 nm to 8 nm.

The first electrode 203 and a metal in contact with the first semiconductor layer may be made of gold, platinum or silver, etc., or a transparent conductive oxide, specifically such as ITO or ZnO. In some embodiments, the first electrode 203 may be made of a multi-layered material, such as at least one of gold germanium nickel, gold beryllium, gold germanium, gold zinc, an alloy material, and combinations thereof. In certain embodiment, the first electrode 203 may also include a reflective metal, such as gold or silver, to reflect partial light toward the semiconductor epitaxial structure from the active layer 107 via the first current spreading layer 104 of the first semiconductor layer, and to facilitate the exit of light from the light-exiting surface of the first current spreading layer 104.

To form the good ohmic contact between the second electrode 204 and the second ohmic contact layer 111 of the second semiconductor layer, in some embodiments, the second electrode 204 may be made of a conductive metal such as gold, platinum or silver. In certain embodiments, the second electrode 204 may be made of a multi-layered material, such as at least one of gold germanium nickel, gold beryllium, gold germanium, gold zinc, an alloy material, and combinations thereof. In some embodiments, to improve the ohmic contact between the second electrode 204 and the second ohmic contact layer 111, at least one metal capable of diffusing into the second ohmic contact layer 111 may be included in the second electrode 204 so as to reduce an ohmic contact resistance. To facilitate the diffusion of the metal into the second ohmic contact layer 111, fusion of the metal may be conducted under at least a temperature of 300° C. The metal may directly contact the second ohmic contact layer 111, such as gold, platinum or silver.

Figure 14:
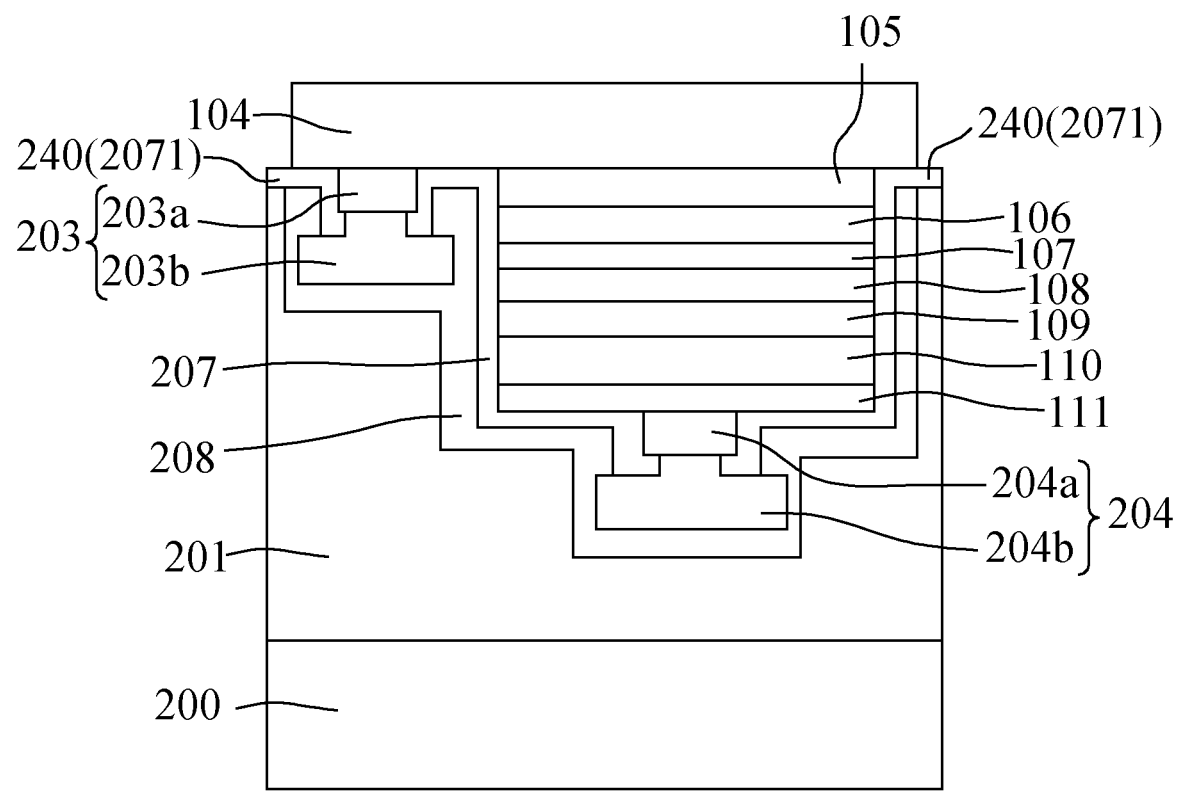
FIG. 14 is a schematic view illustrating the micro light-emitting device according to the sixth embodiment of the disclosure in a supported state before being unitized.

To improve the reliability of the micro light-emitting device, the first mesa (S1), the second mesa (S2), and the side wall of the semiconductor epitaxial structure are covered by an insulation layer 207 (not shown in FIG. 13 but shown in FIG. 14). The insulation layer 207 may be a single or multilayered structure, and composed of at least one material of $SiO_2$, SiNx, $Al_2O_3$, and $Ti_3O_5$. In some embodiments, the insulation layer 207 is a Bragg reflective layer structure, such that the insulation layer 207 is formed by alternatively stacking $Ti_3O_5$ and $SiO_2$. In this embodiment, the insulation layer 207 is made of SiNx or $SiO_2$ and has a thickness no smaller than 1 μm.

In this embodiment, the first electrode 203 and the second electrode 204 are located on a surface opposite the light-exiting surface of the first current spreading layer 104. The first electrode 203 and the second electrode 204 may be electrically connected to external components through the surface opposite to the light-existing surface of the first current spreading layer 104 so as to form a flip-chip structure. The first electrode 203 includes a first ohmic contact portion 203a and a first pad electrode 203b. The second electrode 204 includes the second ohmic contact portion 204a and a second pad electrode 204b. The first pad electrode 203b and the second pad electrode 204b may have at least one layer made of gold, aluminum, silver, etc. so as to achieve die bonding of the electrode 203 and second electrode 204. The first electrode 203 and the second electrode 204 may be equal or unequal in height. The first pad electrode 203b and the second pad electrode 204b do not overlap each other in the thickness direction.

The light-emitting device according to this embodiment may reduce the light absorption of the barrier layer and enhance the uniform distribution of the charge carriers, thereby enhancing the light-emitting efficiency and luminous intensity of the light-emitting device. By having such quantum well structure, and by gradually changing the aluminum content of the second spacing layer 108, overflow of the charge carriers may be reduced, thereby further enhancing the light-emitting efficiency and luminous intensity of the light-emitting device.

FIG. 14 illustrates a base frame 250 that supports the micro light-emitting device shown in FIG. 13 before the micro light-emitting device is unitized, and two bridging arms 240 that are used to connect the micro light-emitting device and the base frame 250. The base frame 250 includes the substrate 200 and the bonding layer 201 that has a receiving space to receive the micro light-emitting device. In this embodiment, the bonding layer 201 is made of a BCB adhesive, silicone, a UV adhesive or resin. The bridging arms 240 may be made of a dielectric, metal or semiconductor material. In some embodiments, a horizontal portion 2071 of the insulation layer 207 is formed into the bridging arms 240 that straddle the bonding layer 201 so as to be connected to the micro light-emitting device and the base frame 250.

To unitize the micro light-emitting device, the micro light-emitting device is separated from the base frame 250 by transfer printing. Materials of transfer printing includes PDMS, silicone, a pyrolytic adhesive, or a UV adhesive. In some cases, a sacrificial layer 208 may be disposed between the micro light-emitting device and the base frame 250 because the sacrificial layer 208 has a higher removal efficiency than the micro light-emitting device. Technical measures for removal include chemical separation or physical separation, such as UV decomposition, etching, or impacting.

Figure 15:
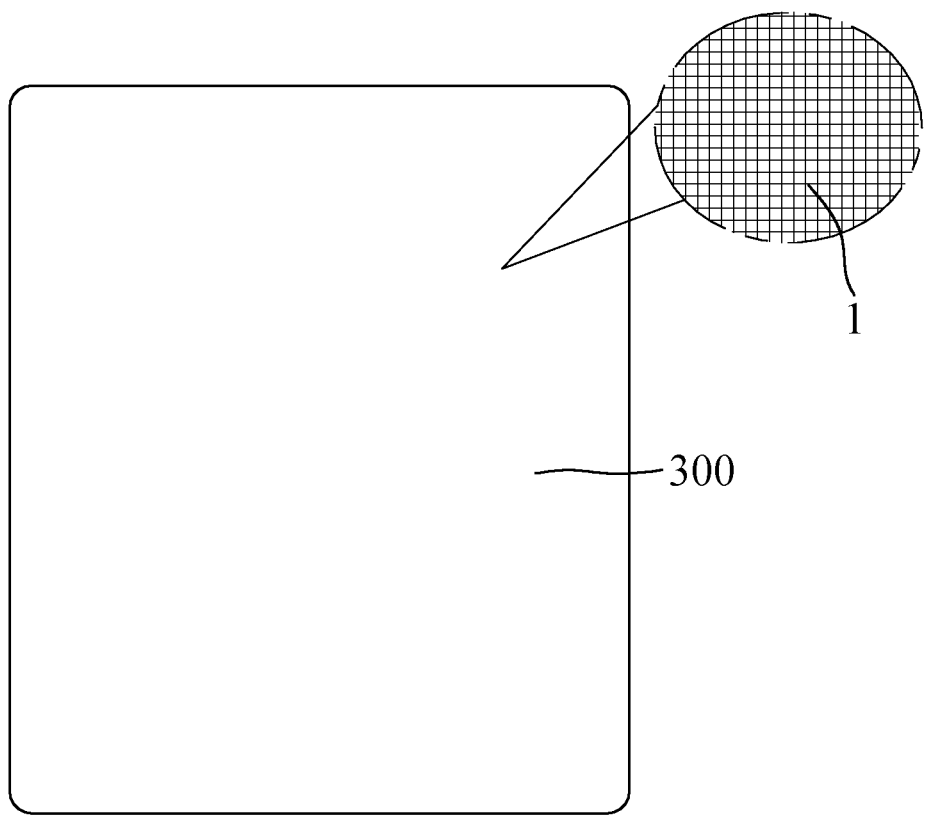
FIG. 15 is a schematic view illustrating a light-emitting equipment according to a seventh embodiment of the disclosure.

Referring to FIG. 15, a light-emitting equipment 300 is provided and includes a plurality of the light-emitting devices as described in any one of the previous embodiments. The light-emitting devices are arranged in arrays. In FIG. 15, only a portion of an array of the light-emitting devices is shown.

In this embodiment, the light-emitting equipment 300 may be used in a dashboard in a military aircraft, a stage light, a projector, or a display.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
a semiconductor epitaxial structure that has a first surface and a second surface opposite to said first surface, and that includes a first semiconductor layer, an active layer, and a second semiconductor layer sequentially stacked on one another in such order from said first surface to said second surface,
wherein said active layer includes a quantum well structure having multiple periodic units, each of which includes a well layer and a barrier layer disposed sequentially in such order, a bandgap of said barrier layer being greater than that of said well layer,
wherein said bandgap of said barrier layer of at least one of said periodic units proximate to said first surface of said semiconductor epitaxial structure is smaller than that proximate to said second surface of said semiconductor epitaxial structure, and
wherein a thickness of said well layer of at least one of said periodic units proximate to said first surface of said semiconductor epitaxial structure is greater than that proximate to said second surface of said semiconductor epitaxial structure.

2. The light-emitting device as claimed in claim 1, wherein said bandgaps of said barrier layers of said periodic units gradually increase in a direction from said first surface of said semiconductor epitaxial structure to said second surface of said semiconductor epitaxial structure, said thicknesses of said well layers of said periodic units gradually decreasing in the direction from said first surface of said semiconductor epitaxial structure to said second surface of said semiconductor epitaxial structure.

3. The light-emitting device as claimed in claim 2, wherein said thicknesses of said well layers decrease from a single one of said periodic units to the next single one of said periodic units, or from one group of said periodic units to the next group of said periodic units in the direction from said first surface of said semiconductor epitaxial structure to said second surface of said semiconductor epitaxial structure.

4. The light-emitting device as claimed in claim 2, wherein a thickness of said well layer of a last one of said periodic units that is proximate to said second surface of said semiconductor epitaxial structure accounts for 50% to 80% of a thickness of said well layer of a first one of said periodic units that is proximate to said first surface of said semiconductor epitaxial structure.

5. The light-emitting device as claimed in claim 1, wherein said bandgaps of said barrier layers of said periodic units first increase in a direction from said first surface of said semiconductor epitaxial structure to said second surface of said semiconductor epitaxial structure, then remain constant, and thereafter increase again in the direction, said thicknesses of said well layers of said periodic units first decreasing in the direction from said first surface of said semiconductor epitaxial structure to said second surface of said semiconductor epitaxial structure, then remaining constant, and thereafter decreasing again in the direction.

6. The light-emitting device as claimed in claim 1, wherein said well layer has a composition represented by $Al_xGa_{1-x}InP$, said barrier layer having a composition represented by $Al_yGa_{1-y}InP$, and $0 \leq x < y \leq 1$.

7. The light-emitting device as claimed in claim 6, wherein a value of y of an aluminum content of said barrier layer ranges from 0.3 to 0.85.

8. The light-emitting device as claimed in claim 6, wherein percentages of aluminum contents in said barrier layers of said periodic units gradually increase in the direction from said first surface of said semiconductor epitaxial structure to said second surface of said semiconductor epitaxial structure.

9. The light-emitting device as claimed in claim 8, wherein percentages of aluminum contents in said barrier layers of said periodic units gradually increase from a single one of said periodic units to the next single one of said periodic units, or from a group of said periodic units to the next group of said periodic units in the direction from said first surface of said semiconductor epitaxial structure to said second surface of said semiconductor epitaxial structure.

10. The light-emitting device as claimed in claim 1, wherein said well layer has a composition represented by $In_xGa_{1-x}As$, said barrier layer having a composition represented by $In_xGa_{1-y}As$, and $0 \leq x \leq 1$, $0 \leq y \leq 1$.

11. The light-emitting device as claimed in claim 1, wherein a number of said periodic units of said active layer ranges from 2 to 100.

12. The light-emitting device as claimed in claim 1, wherein said thickness of said well layer ranges from 5 nm to 25 nm, a thickness of said barrier layer ranging from 5 nm to 25 nm.

13. The light-emitting device as claimed in claim 1 further includes a second spacing layer disposed between said active layer and said second semiconductor layer, a bandgap of said second spacing layer gradually increasing in a direction from said first surface of said semiconductor epitaxial structure to said second surface of said semiconductor epitaxial structure.

14. The light-emitting device as claimed in claim 13, wherein said second spacing layer has a composition represented by $Al_zGa_{1-z}InP$, and a value of z ranges from 0.3 to 1.

15. The light-emitting device as claimed in claim 14, wherein an aluminum content in said second spacing layer increases in the direction from said first surface of said semiconductor epitaxial structure to said second surface of said semiconductor epitaxial structure in one of a linear manner and a stepwise manner.

16. A light-emitting apparatus comprising the light-emitting device as claimed in claim 1.

17. A light-emitting device, comprising:
a semiconductor epitaxial structure that has a first surface and a second surface opposite to said first surface, and that includes a first semiconductor layer, an active layer, and a second semiconductor layer sequentially stacked on one another in such order from said first surface to said second surface,
wherein said active layer includes a quantum well structure having multiple periodic units, each of which includes a well layer and a barrier layer disposed sequentially in such order, a bandgap of said barrier layer being greater than that of said well layer,
wherein a second spacing layer is disposed between said active layer and said second semiconductor layer, and
wherein a thickness of said well layer of at least one of said periodic units proximate to said first surface of said semiconductor epitaxial structure is greater than that proximate to said second surface of said semiconductor epitaxial structure, a bandgap of said second spacing layer gradually increasing in a direction from said first surface of said semiconductor epitaxial structure to said second surface of said semiconductor epitaxial structure.

18. The light-emitting device as claimed in claim 17, wherein said thicknesses of said well layers of said periodic units gradually decrease in the direction from said first surface of said semiconductor epitaxial structure to said second surface of said semiconductor epitaxial structure, or said thicknesses of said well layers of said periodic units first decrease in the direction from said first surface of said semiconductor epitaxial structure to said second surface of said semiconductor epitaxial structure, then remain constant, and thereafter decrease again in the direction.

19. The light-emitting device as claimed in claim 17, wherein said second spacing layer has a composition represented by $Al_zGa_{1-z}InP$, and a value of z ranges from 0.3 to 1.

20. The light-emitting device as claimed in claim 19, wherein an aluminum content in said second spacing layer increases in the direction from said first surface of said semiconductor epitaxial structure to said second surface of said semiconductor epitaxial structure in one of a linear manner and a stepwise manner.

* * * * *